United States Patent
Fujita

(10) Patent No.: US 9,502,140 B2
(45) Date of Patent: Nov. 22, 2016

(54) SEMICONDUCTOR MEMORY DEVICE

(71) Applicant: Katsuyuki Fujita, Seoul (KR)

(72) Inventor: Katsuyuki Fujita, Seoul (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/799,066

(22) Filed: Jul. 14, 2015

(65) Prior Publication Data
US 2015/0318061 A1 Nov. 5, 2015

Related U.S. Application Data

(63) Continuation of application No. 14/014,183, filed on Aug. 29, 2013, now Pat. No. 9,111,624.

(60) Provisional application No. 61/804,548, filed on Mar. 22, 2013.

(51) Int. Cl.
- G11C 7/00 (2006.01)
- G11C 29/00 (2006.01)
- G11C 11/16 (2006.01)
- G11C 29/04 (2006.01)

(52) U.S. Cl.
CPC .......... G11C 29/76 (2013.01); G11C 11/1653 (2013.01); G11C 11/1657 (2013.01); G11C 11/1675 (2013.01); G11C 29/04 (2013.01); G11C 29/787 (2013.01)

(58) Field of Classification Search
CPC . G11C 29/808; G11C 29/785; H05K 999/99
USPC ............................................. 365/200, 189.07
See application file for complete search history.

(56) References Cited

U.S. PATENT DOCUMENTS 5,357,470 A   10/1994   Namekawa et al.
5,487,040 A    1/1996   Sukegawa et al.
(Continued)

FOREIGN PATENT DOCUMENTS

JP    06096598 A    4/1994
JP    11203859 A    7/1999
(Continued)

OTHER PUBLICATIONS

International Preliminary Report on Patentability (IPRP) including Written Opinion (in English) dated Oct. 1, 2015, issued in parent International Application No. PCT/JP2014/057025.
(Continued)

Primary Examiner — Son Dinh
(74) Attorney, Agent, or Firm — Holtz, Holtz & Volek PC

(57) ABSTRACT

According to one embodiment, a semiconductor memory device includes first word lines connected to a memory cell array, second word lines connected to a redundancy area, a first row decoder configured to perform selecting from the first word lines based on a row address, a judgment circuit configured to determine whether or not a replacement operation with the redundancy area is needed based on a redundancy address included in the row address, and a second row decoder configured to perform selecting from the second word lines. The row address includes a first row address and a second row address input in order in a time-sharing method. The first row address includes all of the redundancy address.

16 Claims, 7 Drawing Sheets

(56) References Cited

U.S. PATENT DOCUMENTS

| | | | |
|---|---|---|---|
| 6,067,632 A | 5/2000 | Yamaguchi | |
| 6,134,179 A | 10/2000 | Ooishi | |
| 6,717,877 B2 | 4/2004 | Suzuki et al. | |
| 2002/0093032 A1 | 7/2002 | Hanzawa et al. | |
| 2002/0176287 A1* | 11/2002 | Hur | G11C 29/24 365/200 |
| 2009/0003046 A1* | 1/2009 | Nirschl | G11C 11/5678 365/163 |
| 2009/0190423 A1* | 7/2009 | Nakamura | G11C 29/24 365/200 |

FOREIGN PATENT DOCUMENTS

| | | |
|---|---|---|
| JP | 2001256795 A | 9/2001 |
| JP | 2007250185 A | 9/2007 |
| JP | 2010198694 A | 9/2010 |
| WO | 9631825 A1 | 10/1996 |

OTHER PUBLICATIONS

International Search Report including Written Opinion dated May 27, 2014 (in English) in counterpart International Application No. PCT/JP2014/057025.

Japanese Office Action (and English translation thereof) dated Sep. 20, 2016, issued in counterpart Japanese Application No. 2016-503912.

\* cited by examiner

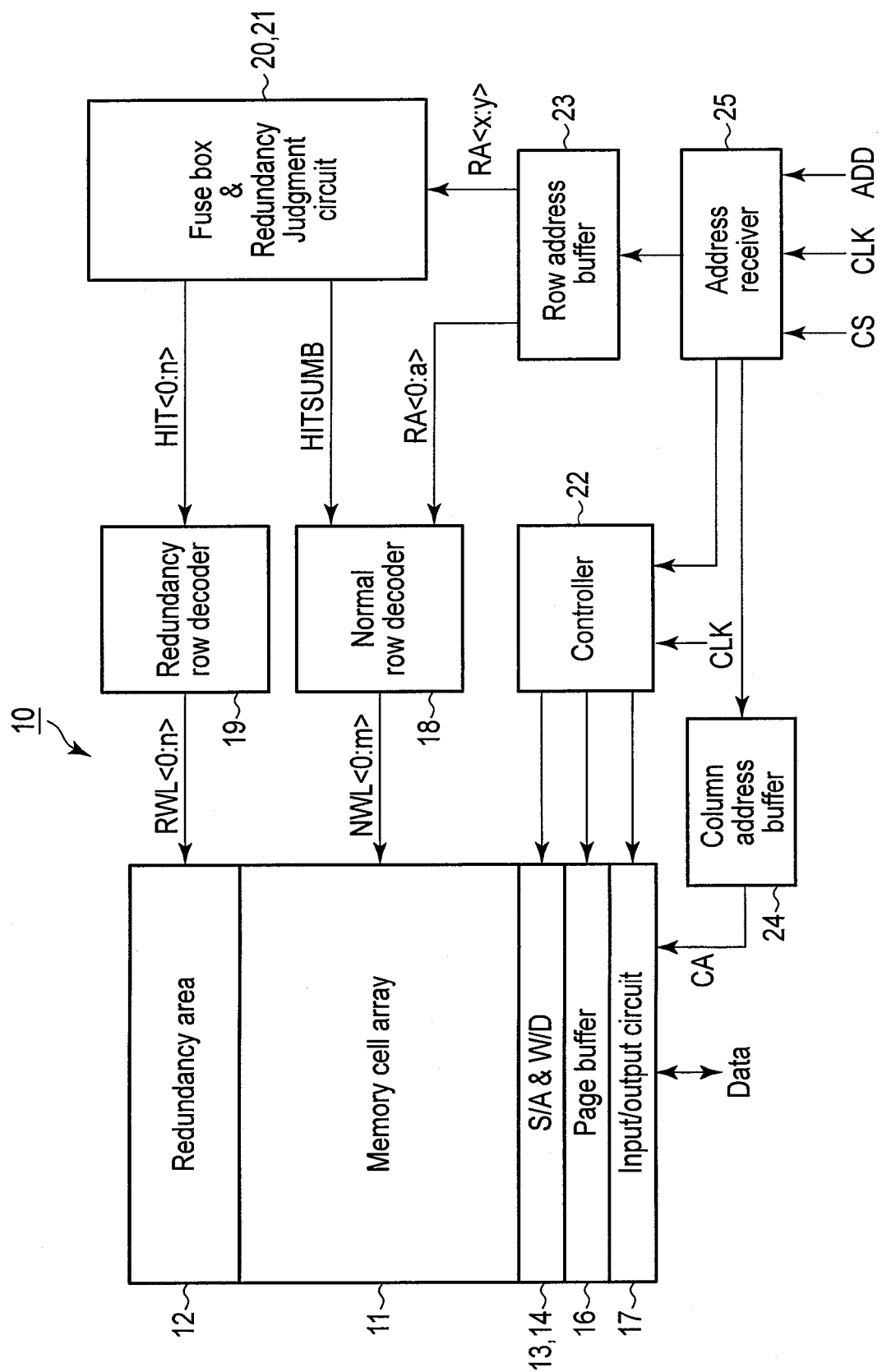
F I G. 1

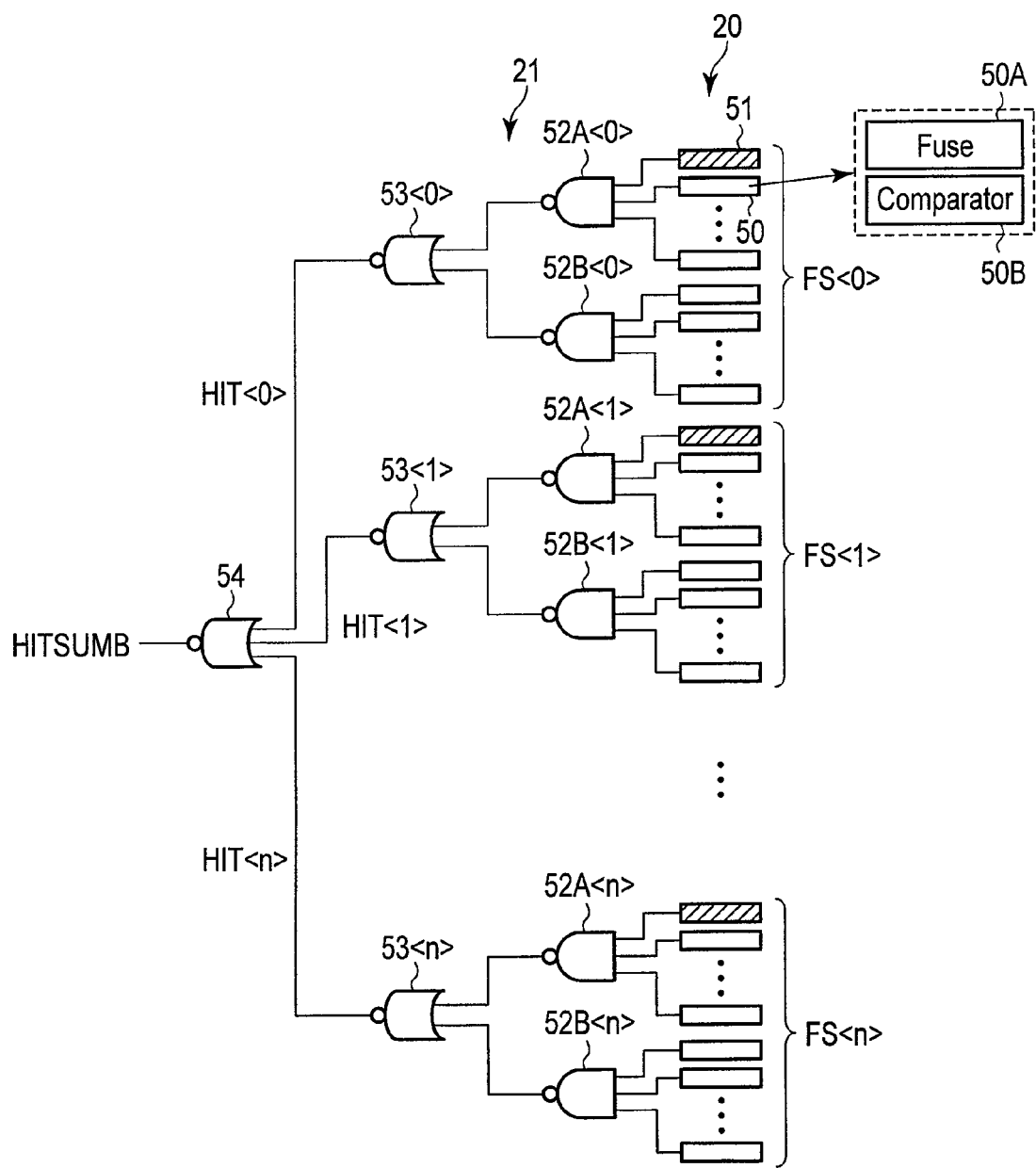
F I G. 3

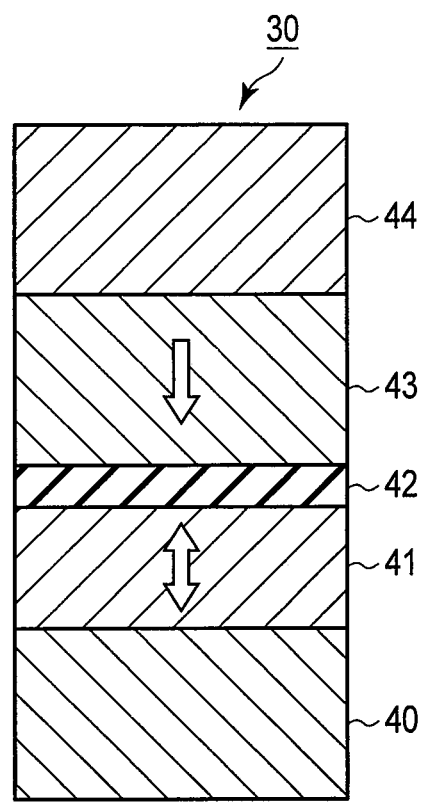
F I G. 4

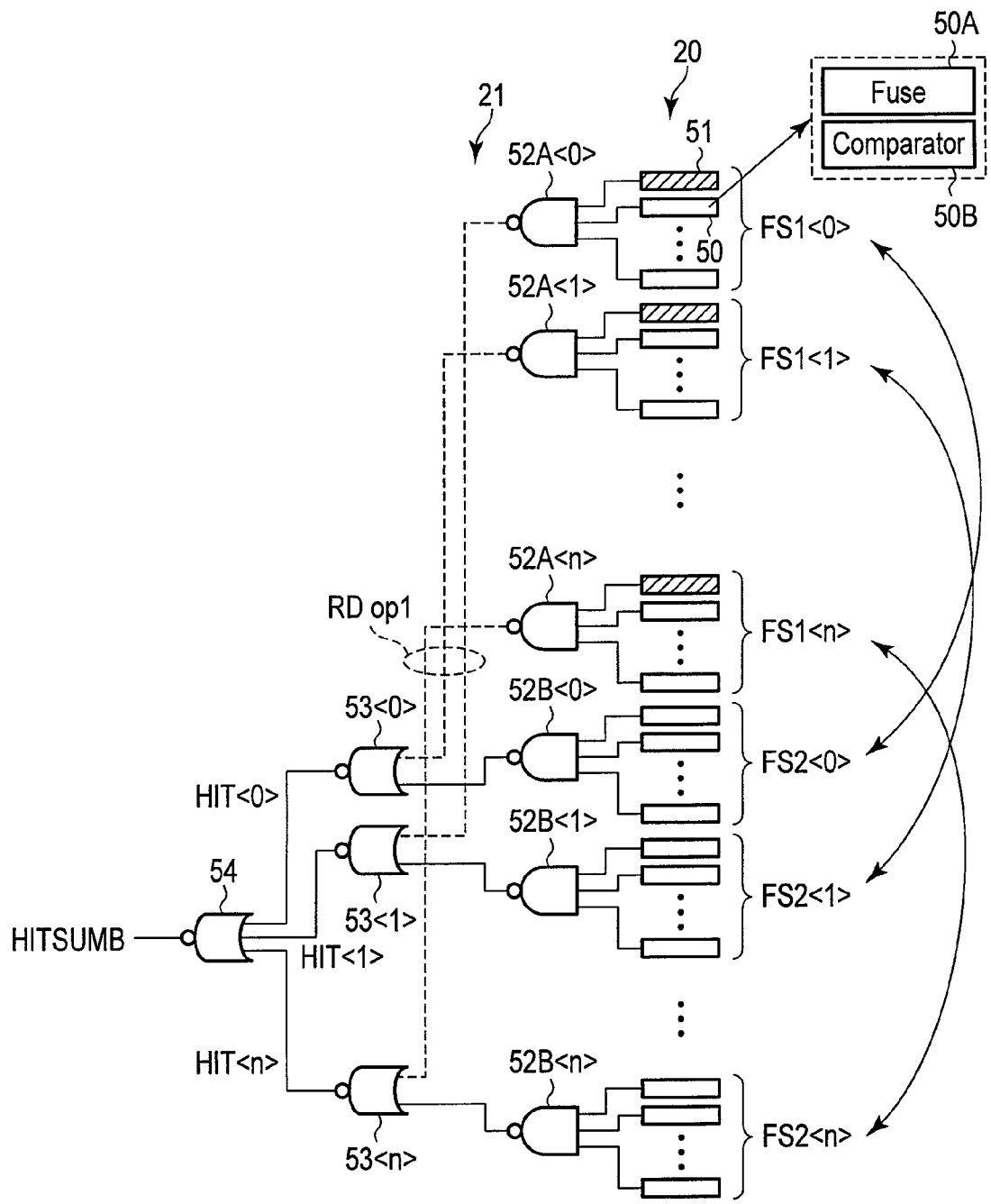
F I G. 7

SEMICONDUCTOR MEMORY DEVICE

CROSS-REFERENCE TO RELATED APPLICATIONS

This is a Continuation of U.S. application Ser. No. 14/014,183, filed Aug. 29, 2013, which is based upon and claims the benefit of U.S. Provisional App. No. 61/804,548, filed Mar. 22, 2013, the entire contents of both of which are incorporated herein by reference.

FIELD

Embodiments of the present invention relate to a semiconductor memory device.

BACKGROUND

In a semiconductor memory device such as an SDRAM, access is performed by, for example, inputting a row address together with an active command and inputting a column address together with a read command/write command. However, in recent years, the size of addresses (the number of bits) has been increased as the storage capacity of a semiconductor memory device increases.

BRIEF DESCRIPTION OF THE DRAWINGS

FIG. 1 is a block diagram of an MRAM according to a first embodiment;

FIG. 3 is a circuit diagram of a fuse box and a redundancy judgment circuit;

FIG. 4 is a cross-sectional view of an MTJ element;

FIG. 7 is a circuit diagram of a fuse box and a redundancy judgment circuit.

DETAILED DESCRIPTION

Figure 2:
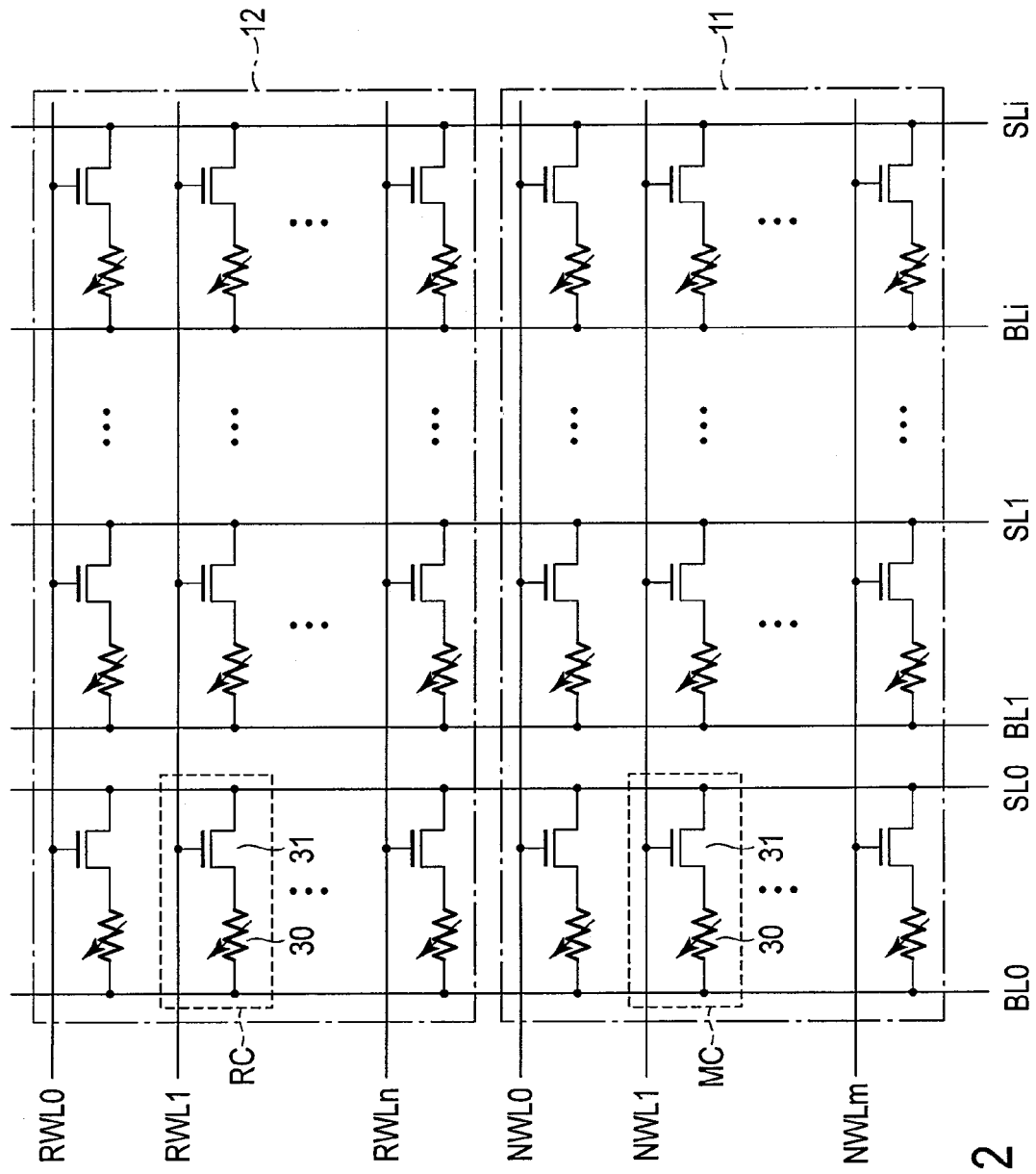
FIG. 2 is a circuit diagram of a memory cell array and a redundancy area.

In general, according to one embodiment, there is provided a semiconductor memory device comprising:

a memory cell array comprising memory cells;

a redundancy area comprising redundancy cells which are used for failure cells in the memory cell array;

first word lines connected to the memory cell array;

second word lines connected to the redundancy area;

a first row decoder configured to perform selecting from the first word lines based on a row address;

a judgment circuit configured to determine whether or not a replacement operation with the redundancy area is needed based on a redundancy address included in the row address; and a second row decoder configured to perform selecting from the second word lines based on a determination result by the judgment circuit, wherein the row address includes a first row address and a second row address input in order in a time-sharing method, and the first row address includes all of the redundancy address.

Embodiments of the present invention will be described below with reference to the drawings. In the description below, components with the same functions and configurations are denoted by the same reference numerals, and duplicate descriptions are provided only when needed.

The embodiments will be described below taking an MRAM (Magnetic Random Access Memory) as an example of a semiconductor memory device.

[First embodiment]
[1. Configuration of the MRAM]
[1-1. General configuration of the MRAM]

FIG. 1 is a block diagram of an MRAM 10 according to a first embodiment. The MRAM 10 comprises a memory cell array 11, a redundancy area 12, a sense amplifier (S/A) 13 serving as a read circuit, a write driver (W/D) 14 serving as a write circuit, an ECC (Error Checking and Correcting) circuit 15, a page buffer (P/B) 16, an input/output circuit 17, a normal row decoder 18, a redundancy row decoder 19, a fuse box 20 serving as a failure address storage unit, a redundancy judgment circuit 21, a controller 22, a row address buffer 23, a column address buffer 24, and an address receiver 25.

The memory cell array 11 comprises a plurality of memory cells arranged in a matrix. The memory cell array 11 comprises a plurality of word lines (normal word lines) NWL<0:m>, a plurality of bit lines, and a plurality of source lines disposed therein. One word line NWL and one pair of a bit line and a source line are connected to one memory cell.

The redundancy area 12 is provided to repair failure memory cells occurring in the memory cell array 11. The redundancy area 12 has a smaller storage capacity than the memory cell array 11 but has the same configuration as that of the memory cell array 11. That is, the redundancy area 12 comprises a plurality of redundancy cells arranged in a matrix. Each of the redundancy cells has the same configuration as that of the memory cell. The redundancy area 12 comprises a plurality of word lines (redundancy word lines) RWL<0:n> arranged therein, and a plurality of bit lines and source lines arranged therein and which are common to the memory cell array 11. One word line RWL and one pair of a bit line and a source line are connected to one redundancy cell. The redundancy area 12 is replaced with the memory cell array 11 in units of one row (a group of memory cells connected to one word line RWL) or a plurality of rows.

The address receiver 25 receives an address ADD, a clock CLK, and a chip select signal CS from an external circuit. The address ADD includes a row address RA and a column address CA. The address ADD and the chip select signal CS are sent to the controller 22. The row address RA is sent to the row address buffer 23. The column address CA is sent to the column address buffer 24.

The column address buffer 24 receives the column address CA from the address receiver 25. The column address buffer 24 sends the column address CA to the sense amplifier 13, the write driver 14, the page buffer 16, and the input/output circuit 17.

The row address buffer 23 receives the row address RA from the address receiver 25. The row address buffer 23 sends a row address RA<0:a> to the normal row decoder 18, and sends a redundancy row address RA<x:y> to the redundancy judgment circuit 21. The redundancy row address RA<x:y> comprises a part of the row address RA<0:a>.

The normal row decoder 18 is connected to a plurality of word lines NWL<0:m> disposed in the memory cell array 11. The normal row decoder 18 selects any one of the plurality of word lines NWL<0:m> based on the row address RA<0:a>.

The redundancy row decoder 19 is connected to a plurality of word lines RWL<0:n> disposed in the redundancy area 12. The redundancy row decoder 19 selects any one of the plurality of word lines RWL<0:n> based on a signal HIT<0:n> sent from the redundancy judgment circuit 21.

The fuse box 20 stores addresses (failure addresses) for use in identifying word lines connected to failure memory cells occurring in the memory cell array 11. The fuse box 20 comprises a plurality of fuse elements configured to store failure addresses. A specific configuration of the fuse box 20 will be described below.

The redundancy judgment circuit 21 compares the redundancy row address RA<x:y> with each of the failure addresses stored in the fuse box 20 to generate a signal HIT<0:n> and a signal HITSUMB as a result of the comparison. The signal HIT<0:n> is sent to the redundancy judgment circuit 21. The signal HITSUMB is sent to the normal row decoder 18. A specific configuration of the redundancy judgment circuit 21 will be described below.

The sense amplifier 13 is connected to a plurality of bit lines. For example, in the case of a voltage detection scheme, the sense amplifier 13 compares a reference voltage with a cell voltage applied to a selected memory cell via the corresponding bit line BL to detect and amplify data in the selected memory cell. The write driver 14 is connected to a plurality of bit lines and a plurality of source lines. The write driver 14 writes data to the selected memory cell via the appropriate bit line and source line.

The page buffer 16 holds write data sent from the input/output circuit 17 and read data sent from the sense amplifier 13.

The input/output circuit 17 is connected to an external circuit to carry out a process of outputting and receiving data to and from the external circuit. The input/output circuit 17 sends input data received from the external circuit to the page buffer as write data. The input/output circuit 17 outputs read data received from the page buffer 16 to the external circuit as output data.

The controller 22 integrally controls the operation of the MRAM 10. The controller 22 receives the clock CLK from the external circuit. The controller 22 supplies various control signals to the sense amplifier 13, the write driver 14, the page buffer 16, and the input/output circuit 17 to control the operations of these circuits.

[1-2. Configuration of the memory cell array and the redundancy area]

Now, a configuration of the memory cell array 11 and the redundancy area 12 will be described. FIG. 2 is a circuit diagram of the memory cell array 11 and the redundancy area 12. The memory cell array 11 comprises a plurality of memory cells MC arranged in a matrix. The memory cell array 11 comprises a plurality of word lines NWL<0:m>, a plurality of bit lines BL<0:i>, and a plurality of source lines SL<0:i>. The memory cell MC is connected to one word line NWL and one pair of a bit line BL and a source line SL.

The memory cell MC comprises a magnetoresistive effect element (MTJ (Magnetic Tunnel Junction) element) 30 and a select transistor 31. The select transistor 31 comprises, for example, an N-channel MOSFET. One end of the MTJ element 30 is connected to the corresponding bit line BL. The other end of the MTJ element 30 is connected to a drain of the select transistor 31. A gate of the select transistor 31 is connected to the corresponding word line NWL. A source of the select transistor 31 is connected to the corresponding source line SL.

The redundancy area 12 comprises a plurality of redundancy cells RC arranged in a matrix. The redundancy area 12 comprise a plurality of word lines RWL<0:n>, a plurality of bit lines BL<0:i>, and a plurality of source lines SL<0:i>. The redundancy cell RC is connected to one word line RWL and one pair of a bit line BL and a source line SL. The redundancy cell RC has the same configuration as that of the memory cell MC.

[1-3. Configuration of the fuse box and the redundancy judgment circuit]

Now, an example of configuration of the fuse box 20 and the redundancy judgment circuit 21 will be described. FIG. 3 is a circuit diagram of the fuse box 20 and the redundancy judgment circuit 21.

The fuse box 20 comprises a plurality of fuse sets FS<0:n> corresponding to the plurality of word lines RWL<0:n>. Each of the fuse sets FS comprises a plurality of fuse units 50 corresponding to the number of bits in the redundancy row address RA<x:y> and one enable fuse unit 51. Each of the fuse units 50 comprises a fuse element 50A and a comparator 50B. The fuse element 50A is, for example, a laser fuse (electric fuse). The enable fuse unit 51 also has the same configuration as that of the fuse unit 50.

The enable fuse unit 51 is used to determine whether or not to use the fuse set FS including this enable fuse unit 51. Information indicating whether or not to use the fuse set FS is programmed in the fuse element in the enable fuse unit 51. The enable fuse unit 51 is configured to output "H" if the fuse set FS is to be used.

An address (failure address) for use in identifying a word line connected to a failure memory cell included in the memory cell array 11 (that is, one of the word lines in the memory cell array 11 which is to be replaced with the redundancy area 12) is programmed in each of the plurality of fuse elements 50A included in the plurality of fuse units 50 in each fuse set FS. The fuse unit 50 (specifically, the comparator 50B) compares an address bit input to the fuse unit 50 itself with a bit stored in the fuse element 50A. If the address bit matches the stored bit, the fuse unit 50 outputs "H".

The redundancy judgment circuit 21 comprises a plurality of (for example, two) NAND gates 52A and 52B connected to each fuse set FS and a NOR gate 53 connected to outputs of the NAND gates 52A and 52B. The redundancy judgment circuit 21 further comprises a NOR gate 54 connected to outputs of a plurality of NOR gates 53<0:n> corresponding to a plurality of word lines RWL<0:n>.

If the failure address stored in the fuse set FS<0> matches the redundancy row address RA<x:y>, the redundancy judgment circuit 21 asserts a signal HIT<0> (outputs "H"). The signal HIT<1:n> operates similarly to the signal HIT<0>. The signal HIT<0:n> is sent to the redundancy row decoder 19. Finally, the redundancy word line RWL<α> corresponding to the asserted signal HIT<α> is activated.

Furthermore, if any of the signals HIT<0:n> is asserted, the redundancy judgment circuit 21 asserts the signal HITSUMB (outputs "L"). The signal HITSUMB is sent to the normal row decoder 18. The signal HITSUMB at the "L" level means that an operation of replacement with the redundancy area 12 is to be performed. Hence, if the signal HITSUMB is at the "L" level, the normal row decoder 18 operates to avoid activating the word line NWL<0:m>.

[1-4. Structure of the MTJ element]

Now, an example of the structure of the MTJ element 30 will be described. FIG. 4 is a cross-sectional view of the MTJ element 30. The MTJ element comprises a lower electrode 40, a memory layer (also referred to as a free layer) 41, a nonmagnetic layer (tunnel barrier layer) 42, a reference layer (also referred to as a fixed layer) 43, and an upper electrode 44 stacked in this order. The order in which the memory layer 41 and the reference layer 43 are stacked may be reversed.

The memory layer 41 and the reference layer 43 are each formed of a ferromagnetic material. The tunnel barrier layer 42 used is, for example, an insulating material such as MGO.

Each of the memory layer 41 and the reference layer 43 has perpendicular magnetic anisotropy and a direction of easy magnetization equal to a perpendicular direction. The memory layer 41 and the reference layer 43 have a magnetization direction equal to an in-plane direction.

The memory layer 41 has a variable magnetization direction (the magnetization direction is inverted). The reference layer 43 has an invariable magnetization direction (the magnetization direction is fixed). The reference layer 43 is set to have perpendicular magnetic anisotropy energy sufficiently higher than the perpendicular magnetic anisotropy energy of the memory layer 41. The magnetic anisotropy can be set by adjusting the composition of materials or film thicknesses. A magnetization inversion current in the memory layer 41 is reduced as described above such that a magnetization inversion current in the reference layer is larger than the magnetization inversion current in the memory layer 41. Thus, the resultant MTJ element 30 comprises the memory layer 41 with a magnetization direction that is variable with respect to a predetermined write current and the reference layer 43 with a magnetization direction that is invariable with respect to a predetermined write current.

The present embodiment uses a spin-transfer write scheme in which a write current is passed directly through the MTJ element 30 to control the magnetization state of the MTJ element 30. The MTJ element 30 can be placed in either a low resistance state or a high resistance state depending on whether the correlation between the magnetization in the memory layer 41 and the magnetization in the reference layer 43 is in a parallel state or in an anti-parallel state.

When a write current flowing from the memory layer 41 toward the reference layer 43 is passed through the MTJ element 30, the correlation between the magnetization in the memory layer 41 and the magnetization in the reference layer 43 is placed in the parallel state. In the parallel state, the MTJ element 30 has the lowest resistance value and is set to the low resistance state. The low resistance state of the MTJ element 30 is defined, for example, as data "0".

On the other hand, when a write current flowing from the reference layer 43 toward the memory layer 41 is passed through the MTJ element 30, the correlation between the magnetization in the memory layer 41 and the magnetization in the reference layer 43 is placed in the anti-parallel state. In the anti-parallel state, the MTJ element 30 has the highest resistance value and is set to the high resistance state. The high resistance state of the MTJ element 30 is defined, for example, as data "1".

Thus, the MTJ element 30 can be used as a storage element that can store 1 bit data (binary data). The assignment of the resistance state and the data for the MTJ element 30 can be optionally set.

Data is read from the MTJ element 30 by applying a read current to the MTJ element 30 and detecting the resistance value of the MTJ element 30 based on a read current flowing through the MTJ element 30 during the application of the read voltage. The read current is set to a value sufficiently smaller than a threshold beyond which magnetization is inverted by spin transfer.

[2. Operation]

Figure 5:
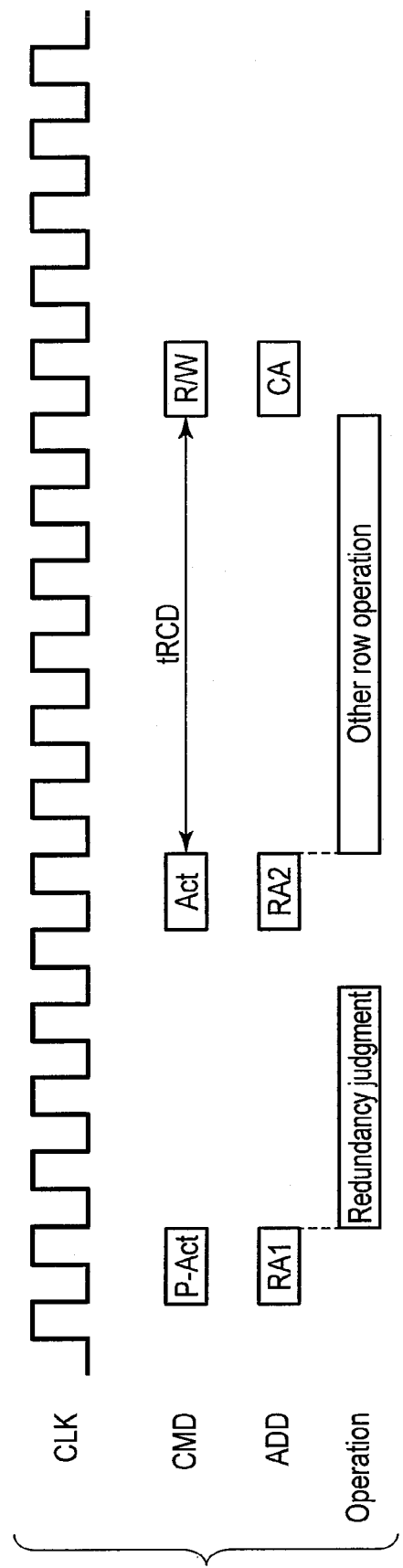
FIG. 5 is a timing chart showing operation of the MRAM.

Now, the operation of the MRAM 10 configured as described above will be described. FIG. 5 is a timing chart showing the operation of the MRAM 10. The MRAM 10 operates in synchronism with the clock CLK sent from the external circuit.

When the storage capacity of the memory cell array 11 grows to increase the number of rows that can be specified by the row address RA in a data read operation and a data write operation, the number of bits in the row address RA correspondingly increases. Thus, in the present embodiment, the row address RA for use in selecting from the rows (word lines) in the memory cell array 11 is divided into a first row address RA1 and a second row address RA2, which are separately input to the MRAM 10 from the external circuit. That is, the first row address RA1 and the second row address RA2 are input from the external circuit to the MRAM 10 in this order in a time-sharing method.

Furthermore, in the present embodiment, if the first row address RA1 is received, a redundancy determination operation is performed, and subsequently, the second row address RA2 is received. When all of the row address RA<0:a> is obtained, operations other than the redundancy determination operation which use the row address RA are performed. Thus, the first row address RA1 is configured to include the redundancy row address RA<x:y>. The second row address RA2 comprises all of the row address RA<0:a> except for the first row address RA1.

First, the controller 22 receives a pre-active command P-Act, and the row address buffer 23 receives the first row address RA1 from the external circuit. The pre-active command P-Act is input before an active command Act described below and used to input the first row address RA1 to the MRAM 10. Subsequently, the row address buffer 23 sends the first row address RA1 to the fuse box 20 and the redundancy judgment circuit 21.

Subsequently, the fuse box 20 and the redundancy judgment circuit 21 perform a redundancy determination operation of determining whether or not the failure address stored in the fuse set FS matches the redundancy row address RA<x:y> included in the first row address RA1. Specifically, each fuse set FS compares the failure address stored in the fuse elements with the redundancy row address RA<x:y>. If the addresses match, the fuse set FS outputs a signal HIT at the "H" level, and if the addresses fail to match, the fuse set FS outputs a signal HIT at the "L" level. The signal HIT is sent to the redundancy row decoder 19.

Moreover, if any of the signals HIT<0:n> is at the "H" level, the redundancy judgment circuit 21 outputs the signal HITSUMB at the "L" level. If all of the signals HIT<0:n> are at the "L" level, that is, replacement with the redundancy area 12 is not carried out, the redundancy area 12 outputs the signal HITSUMB at the "H" level. The signal HITSUMB is sent to the normal row decoder 18.

Subsequently, the controller 22 receives the active command Act from the external circuit. The row address buffer 23 receives the second row address RA2 from the external circuit. The active command Act allows execution of a process of activating one (a selected word line) of a plurality of word lines in a selected bank and reading data from the memory cell array 11 to the page buffer 16. In actuality, one MRAM 10 shown in FIG. 1 corresponds to one bank, and a plurality of banks are mounted on a substrate to form a nonvolatile memory. At this time, all of the row address RA<0:a>, comprising the first row address RA1 and the second row address RA2, is obtained. The row address RA<0:a> is then sent from the row address buffer 23 to the normal row decoder 18.

Subsequently, as long as the signal HITSUMB is at the "H" level, the normal row decoder 18 uses the row address RA<0:a> to activate one of the word lines NWL<0:m>. If the selected word line is failure (the signal HITSUMB is at the "L" level), the word line is replaced with the redundancy area 12. Specifically, the redundancy decoder 19 activates one of the word lines RWL<0:n> based on the signal HIT<0:n>. Subsequently, the sense amplifier 13 reads data from the memory cell array 11. The read data is written to the page buffer 16 via the ECC circuit 15.

Subsequently, the controller 22 receives a read command or a write command (R/W) from the external circuit. The column address buffer 24 receives a column address CA from the external circuit. Thereafter, the controller 22 performs a read operation or a write operation on the column designated by the column address CA.

[Effects]

As described above in detail, the first embodiment is as follows. The first row address RA1 and the second row address RA2, included in the row address RA, are input to the MRAM 10 in this order in a time-sharing method. The first row address RA1, which is input earlier, is configured to include all of the redundancy address related to a redundancy replacement operation. Then, the redundancy replacement operation is started immediately after the reception of the first row address RA1.

Thus, the first embodiment allows a redundancy determination operation to be performed before the active command Act is received, enabling an apparent reduction in time required for the redundancy determination. This enables a reduction in a delay time tRCD (RAS to CAS delay) from the reception of the active command Act until the reception of the read command or the write command, thus increasing the operating speed of the MRAM 10.

[Second embodiment]

According to a second embodiment, the row address RA for use in selecting from the rows (word lines) in the memory cell array 11 is divided into the first row address RA1 and the second row address RA2. The first row address RA1 and the second row address RA2 are separately input to the MRAM 10 from the external circuit. That is, the first row address RA1 and the second row address RA2 are input from the external circuit to the MRAM 10 in this order in a time-sharing method.

Furthermore, according to the present embodiment, the first row address RA1 is configured to include a part of the redundancy row address RA<x:y>. The second row address RA2 comprises all of the row address RA<0:a> except for the first row address RA1. That is, the second row address RA2 also includes a part of the redundancy row address RA<x:y>. After the first row address RA1 is received, a part of the redundancy determination operation is performed. Subsequently, upon receiving the second row address RA2 to obtain all of the row address RA<0:a>, the MRAM performs all of the remaining part of the redundancy determination operation and the operations other than the redundancy determination operation which use the row address RA.

Figure 6:
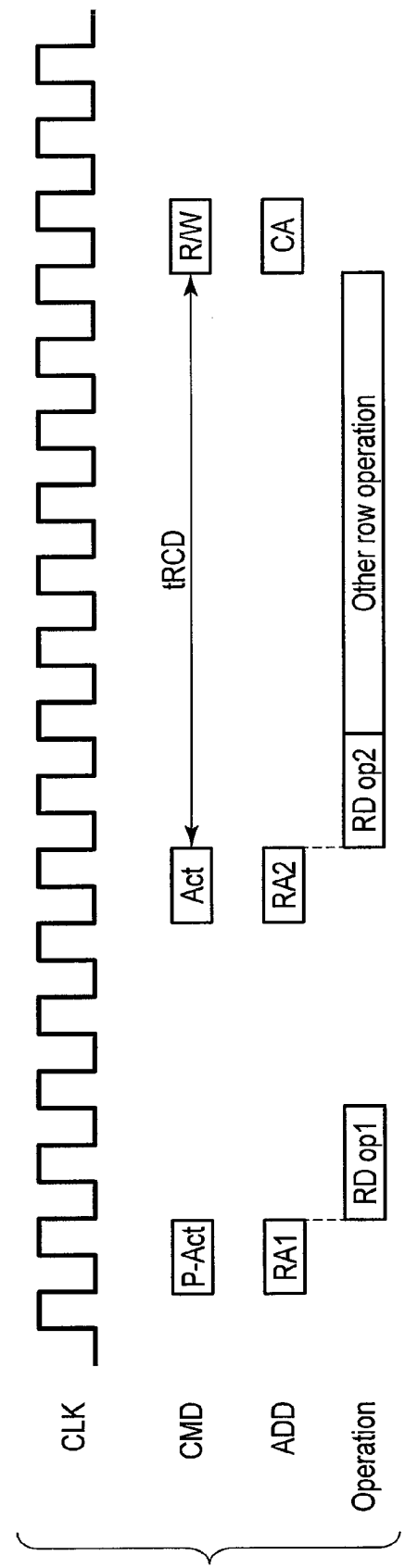
FIG. 6 is a timing chart showing operation of an MRAM according to a second embodiment.

FIG. 6 is a timing chart showing the operation of the MRAM 10 according to the second embodiment. First, the controller 22 receives the pre-active command P-Act from the external circuit, and the row address buffer 23 receives the first row address RA1 from the external circuit. Then, the row address buffer 23 sends the first row address RA1 to the fuse box 20 and the redundancy determination circuit 21.

Subsequently, the fuse box 20 and the redundancy judgment circuit 21 perform a redundancy determination operation of determining whether or not the failure address stored in the fuse set FS matches a part of the redundancy row address RA<x:y> included in the first row address RA1, that is, the fuse box 20 and the redundancy judgment circuit 21 perform a part of the redundancy determination operation ("PD op1" in FIG. 6).

Subsequently, the controller 22 receives the active command Act from the external circuit. The row address buffer 23 receives the second row address RA2 from the external circuit. At this time, all of the row address RA<0:a>, comprising the first row address RA1 and the second row address RA2, is obtained and sent from the row address buffer 23 to the normal row decoder 18. Furthermore, all of the remaining part of the redundancy row address RA<x:y> is sent from the row address buffer 23 to the fuse box 20 and the redundancy judgment circuit 21.

Subsequently, the fuse box 20 and the redundancy judgment circuit 21 use the redundancy row address RA<x:y> to perform all of the remaining part of the redundancy determination operation ("RD op2" in FIG. 6).

Subsequently, the normal row decoder 18 uses the row address RA<0:a> to activate the selected word line. If the selected word line is failure, the word line is replaced with the redundancy area 12. Thereafter, the sense amplifier 13 reads data from the memory cell array 11, and the read data is written to the page buffer 16 via the ECC circuit 15. The subsequent operation is the same as the corresponding operation in the first embodiment.

(Example of configuration of the fuse box 20 and the redundancy judgment circuit 21)

Now, an example of configuration of the fuse box 20 and the redundancy judgment circuit 21 will be described. FIG. 7 is a circuit diagram of the fuse box 20 and the redundancy judgment circuit 21. A circuit portion of FIG. 7 corresponds to a critical path for the redundancy determination operation. Reducing the time required for processing in the circuit portion is important.

In the present embodiment, first fuse sets FS1<0:n> of the fuse sets FS<0:n> which correspond to the redundancy row address (a part of the redundancy row address RA<x:y>) included in the first row address RA1 are collectively arranged at a short distance from one another. Furthermore, second fuse sets FS2<0:n> in the fuse sets FS<0:n> which correspond to the redundancy row address (all of the remaining part of the redundancy row address RA<x:y>) included in the second row address RA2 are collectively arranged at a short distance from one another. Moreover, the first fuse sets FS1<0:n> corresponding to the first row address RA1, which is input earlier and involves a relatively sufficient time for a calculation, are arranged away from a circuit (NOR gate 53<0:n>) configured to calculate the signal HIT<0:n> and a circuit (NOR gate 54) configured to calculate the signal HITSUMB. The second fuse sets FS2<0:n> corresponding to the second row address RA1, which is input later, are arranged closer to the NOR gate 53<0:n> and the NOR gate 54 than the first fuse sets FS1<0:n>.

Thus, when the second row address RA2 is input, the redundancy determination operation ("RD op1" in FIG. 7) related to the first row address RA1 has already been completed. Consequently, the redundancy determination operation ("RD op2" in FIG. 6) performed after the input of the active command Act is only the arithmetic process related to the second fuse sets FS, arranged close to the NOR gate 54. This enables a reduction in the time required for the redundancy determination operation performed after the inputting of the active command Act.

(Effects)

As described above in detail, according to the second embodiment, the first row address RA1 and the second row address RA2, included in the row address RA, are input to the MRAM 10 in this order in a time-sharing method. The first row address RA1, which is input earlier, is configured to include a part of the redundancy address related to the redundancy replacement operation. Then, the redundancy determination operation is started immediately after the reception of the first row address RA1.

Thus, the second embodiment allows a part of the redundancy determination operation to be performed before the active command Act is received, enabling an apparent reduction in the time required for the redundancy determination. This enables a reduction in the delay time tRCD, thus increasing the operating speed of the MRAM 10.

Furthermore, the first fuse sets FS1<0:n> corresponding to the first row address RA1 are arranged away from the circuit configured to calculate the signal HIT<0:n> and the circuit configured to calculate the signal HITSUMB. An arithmetic process related to the first fuse sets FS1<0:n> is carried out earlier. This enables a further reduction in the time required for the redundancy determination operation related to the second row address RA2, which is input later.

Each of the above-described embodiments is configured to divide the whole row address RA into two addresses and to input the addresses in a time-sharing method. However, the embodiments are not limited to this configuration. The whole row address may be divided into three or more addresses, which are then input in a time-sharing method. In conjunction with this, the redundancy row address may be divided into two or more addresses before input.

Furthermore, each of the above-described embodiments takes the MRAM as an example of the semiconductor memory device. However, the embodiments are not limited to the MRAM but are applicable to any other memory such as an SDRAM (Synchronous DRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array comprising memory cells; and
a redundancy area comprising redundancy cells which are used for failure cells in the memory cell array;
wherein:
the semiconductor memory device receives an address from outside,
the address includes a first portion, a second portion, and a third portion which are input in order and divided from each other,
the first portion includes a redundancy address for the redundancy area,
the first portion is input with a command, and
a first time interval between the first portion and the second portion is different from a second time interval between the second portion and the third portion.

2. The device of claim 1, wherein the first time interval between the first portion and the second portion is shorter than the second time interval between the second portion and the third portion.

3. The device of claim 1, wherein the first portion, the second portion, and the third portion are input in a time-sharing method.

4. The device of claim 1, further comprising a judgment circuit which determines whether or not a replacement operation with the redundancy area is needed based on the redundancy address.

5. The device of claim 4, wherein the judgment circuit starts a determination operation after the first portion is input.

6. The device of claim 4, further comprising fuse sets which store failure addresses identifying the failure cells in the memory cell array,
wherein the judgment circuit determines whether or not the redundancy address matches one of the failure addresses stored in the fuse sets.

7. The device of claim 1, further comprising a decoder which decodes the address.

8. The device of claim 1, wherein each of the memory cells comprises a magnetoresistive effect element.

9. A semiconductor memory device comprising:
a memory cell array comprising memory cells; and
a redundancy area comprising redundancy cells which are used for failure cells in the memory cell array,
wherein:
the semiconductor memory device receives an address from outside,
the address includes a first portion, a second portion, and a third portion which are input in order and divided from each other,
the first portion includes a redundancy address for the redundancy area,
the first portion is input with a command, and
a number of cycles between the first portion and the second portion is different from a number of cycles between the second portion and the third portion.

10. The device of claim 9, wherein the number of cycles between the first portion and the second portion is shorter than the number of cycles between the second portion and the third portion.

11. The device of claim 9, wherein the first portion, the second portion, and the third portion are input in a time-sharing method.

12. The device of claim 9, further comprising a judgment circuit which determines whether or not a replacement operation with the redundancy area is needed based on the redundancy address.

13. The device of claim 12, wherein the judgment circuit starts a determination operation after the first portion is input.

14. The device of claim 12, further comprising fuse sets which store failure addresses identifying the failure cells in the memory cell array,
wherein the judgment circuit determines whether or not the redundancy address matches one of the failure addresses stored in the fuse sets.

15. The device of claim 9, further comprising a decoder which decodes the address.

16. The device of claim 9, wherein each of the memory cells comprises a magnetoresistive effect element.

* * * * *